(12) United States Patent
Belonio, Jr. et al.

(10) Patent No.: US 11,114,359 B2
(45) Date of Patent: Sep. 7, 2021

(54) WAFER LEVEL CHIP SCALE PACKAGE STRUCTURE

(71) Applicant: Dialog Semiconductor (UK) Limited, London (GB)

(72) Inventors: Jesus Mennen Belonio, Jr., Neubiberg (DE); Shou Cheng Eric Hu, Taichung (TW); Ian Kent, Chippenham (GB); Ernesto Gutierrez, III, Swindon (GB); Jerry Li, Taichung (TW)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 16/130,378

(22) Filed: Sep. 13, 2018

(65) Prior Publication Data

US 2020/0091026 A1    Mar. 19, 2020

(51) Int. Cl.
*H01L 23/48*     (2006.01)
*H01L 23/52*     (2006.01)
(Continued)

(52) U.S. Cl.
CPC ........ *H01L 23/3128* (2013.01); *H01L 21/568* (2013.01); *H01L 21/76802* (2013.01);
(Continued)

(58) Field of Classification Search
CPC ............. H01L 23/3128; H01L 23/5389; H01L 21/568; H01L 24/14; H01L 23/53233; H01L 23/528; H01L 23/481; H01L 23/3114; H01L 21/76802; H01L 2224/92244; H01L 2224/32225; H01L 2224/73267; H01L 2224/12105; H01L 2224/04105; H01L 2224/16227; H01L 2924/19105; H01L 2224/82101; H01L 2224/83123; H01L 2224/83132; H01L 2224/24226; H01L 24/19; H01L 24/20; H01L 24/82; H01L 24/24;
(Continued)

(56) References Cited

U.S. PATENT DOCUMENTS

| | | | |
|---|---|---|---|
| 7,420,128 B2* | 9/2008 | Sunohara | H01L 23/5389 174/260 |
| 7,563,987 B2* | 7/2009 | Sunohara | H01L 23/5389 174/260 |

(Continued)

*Primary Examiner* — Ismail A Muse
(74) *Attorney, Agent, or Firm* — Saile Ackerman LLC; Stephen B. Ackerman; Rosemary L. S. Pike

(57) ABSTRACT

At least one redistribution layer (RDL) is provided on a silicon die. A passivation layer is deposited on the RDL. First openings having a first diameter are etched in the passivation layer where copper posts are to be formed. A seed layer is deposited over the passivation layer and within the openings. A photoresist layer is coated on the seed layer and patterned to form second openings having a second diameter over the first openings larger than the first diameter. Copper is plated on the seed layer to form copper posts filling the second openings. The silicon die is die attached to a metal substrate. A lamination layer is coated over the silicon die and the copper posts. Third openings are formed through the lamination layer to the copper posts and to metal pads on the metal substrate. Metal vias are formed in the third openings.

14 Claims, 4 Drawing Sheets

(51) Int. Cl.
*H01L 23/31* (2006.01)
*H01L 23/528* (2006.01)
*H01L 21/768* (2006.01)
*H01L 23/532* (2006.01)
*H01L 23/00* (2006.01)
*H01L 21/56* (2006.01)
*H01L 23/538* (2006.01)

(52) U.S. Cl.
CPC ........ *H01L 23/3114* (2013.01); *H01L 23/481* (2013.01); *H01L 23/528* (2013.01); *H01L 23/5389* (2013.01); *H01L 23/53233* (2013.01); *H01L 24/14* (2013.01)

(58) Field of Classification Search
CPC . H01L 2223/54486; H01L 2223/54426; H01L 23/544
See application file for complete search history.

(56) References Cited

U.S. PATENT DOCUMENTS

| | | | |
|---|---|---|---|
| 8,309,860 B2 * | 11/2012 | Sunohara | H01L 23/5383 174/260 |
| 8,686,556 B2 | 4/2014 | Clark et al. | |
| 9,153,494 B2 * | 10/2015 | Choi | H01L 21/561 |
| 9,312,198 B2 * | 4/2016 | Meyer | H01L 23/31 |
| 9,520,342 B2 | 12/2016 | Michael et al. | |
| 9,559,029 B2 | 1/2017 | Shim et al. | |
| 2004/0159933 A1 * | 8/2004 | Sunohara | H01L 21/4857 257/700 |
| 2005/0211465 A1 * | 9/2005 | Sunohara | H01L 23/5389 174/260 |
| 2005/0230835 A1 * | 10/2005 | Sunohara | H01L 23/5389 257/758 |
| 2006/0003495 A1 * | 1/2006 | Sunohara | H01L 24/82 438/124 |
| 2009/0039491 A1 * | 2/2009 | Kim | H01L 21/561 257/686 |
| 2010/0101849 A1 * | 4/2010 | Sunohara | H01L 23/5383 174/260 |
| 2011/0304049 A1 * | 12/2011 | Shigihara | H01L 24/11 257/762 |
| 2012/0032340 A1 * | 2/2012 | Choi | H01L 21/561 257/774 |
| 2012/0168944 A1 * | 7/2012 | Gan | H01L 25/16 257/738 |
| 2012/0247819 A1 * | 10/2012 | Tsuyutani | H01L 23/5389 174/257 |
| 2013/0122657 A1 * | 5/2013 | Shimizu | H01L 23/3185 438/124 |
| 2013/0299973 A1 * | 11/2013 | Choi | H01L 21/561 257/737 |
| 2013/0334682 A1 * | 12/2013 | Kim | H01L 23/295 257/737 |
| 2015/0155262 A1 * | 6/2015 | Kim | H01L 23/295 438/126 |
| 2015/0357274 A1 * | 12/2015 | Choi | H01L 21/561 257/737 |
| 2016/0233167 A1 * | 8/2016 | Shimizu | H01L 21/4857 |
| 2016/0254229 A1 * | 9/2016 | Yu | H01L 24/20 257/659 |
| 2017/0086293 A1 * | 3/2017 | Cheng | H05K 1/0204 |
| 2017/0358548 A1 * | 12/2017 | Lee | H01L 24/14 |
| 2018/0138148 A1 * | 5/2018 | Chen | H01L 25/0655 |
| 2018/0151485 A1 * | 5/2018 | Kao | H01L 21/486 |
| 2019/0044483 A1 * | 2/2019 | Arigong | H03F 1/565 |
| 2019/0229078 A1 * | 7/2019 | Kim | H01L 23/5389 |

* cited by examiner

WAFER LEVEL CHIP SCALE PACKAGE STRUCTURE

TECHNICAL FIELD

This disclosure is related to wafer packaging technologies, and more particularly, to improved wafer level chip scale packaging.

BACKGROUND

The IOT (internet of things) is the new reality and the connection of billions of mobile devices to the cloud with infinite data sharing possibilities can be expected in the future. Each of these devices will require, at a minimum, a microcontroller to add intelligence to the device, one or more sensors to allow for data collection, one or more chips to allow for connectivity and data transmission, and a memory component. Semiconductor device manufacturers are constantly confronted with device integration challenges as consumers want electronics to be smaller, more portable, and more multi-functional than ever.

The current WLCSP (Wafer Level Chip Scale Package) structure cannot be directly embedded into a substrate without removing solder balls because solder material will melt after reflow and further cause reliability issues. It is desired to embed a WLCSP into a substrate and to replace solder balls with copper posts.

U.S. Pat. No. 9,520,342 (Michael et al), U.S. Pat. No. 9,312,198 (Meyer et al), U.S. Pat. No. 8,686,556 (Clark et al), and U.S. Pat. No. 9,559,029 (Shim et al) show various types of packages. All of these references are different from the present disclosure.

SUMMARY

It is the primary objective of the present disclosure to provide a wafer level chip scale package embedded in a substrate.

It is another objective of the disclosure to provide an improved wafer level chip scale package having copper post instead of solder ball interconnections and being embedded in a substrate.

It is a further objective of the disclosure to provide a process for fabricating a wafer level chip scale package having copper post instead of solder ball interconnections and being embedded in a substrate.

Yet another objective is to provide a process for fabricating a wafer level chip scale package embedded in a substrate having high current carrying capacity and electromagnetic shielding.

In accordance with the objectives of the present disclosure, a wafer level chip scale package is achieved comprising a silicon die on a metal substrate and metal vias through a lamination layer over the silicon die, the metal vias providing connections to at least one copper post on the silicon die and to at least one metal pad on the metal substrate.

Also in accordance with the objectives of the present disclosure, a method of fabricating a wafer level chip scale package is achieved. At least one redistribution layer (RDL) is provided on a silicon die. A passivation layer is deposited on the RDL. First openings having a first diameter are etched in the passivation layer where copper posts are to be formed. A seed layer is deposited over the passivation layer and within the openings. A photoresist layer is coated on the seed layer and patterned to form second openings having a second diameter over the first openings wherein the second diameter is larger than the first diameter. Copper is plated on the seed layer in the first and second openings to form copper posts filling the second openings. The silicon die is die attached to a metal substrate. A lamination layer is coated over the silicon die and the copper posts. Third openings are formed through the lamination layer to the copper posts and to metal pads on the metal substrate. Metal vias are formed in the third openings. The metal vias are covered with a solder mask to complete the wafer level chip scale package.

BRIEF DESCRIPTION OF THE DRAWINGS

In the accompanying drawings forming a material part of this description, there is shown.

DETAILED DESCRIPTION

The present disclosure describes a structure and a process in which a wafer level chip scale package (WLCSP) can be embedded into a substrate having high current carrying capacity. Other chips and passive components are further integrated in the same substrate. Only copper (Cu) posts are required in this structure to connect the circuit embedded in the substrate, rather than solder balls that are used in the prior art. The Cu post thickness can be adjusted through an electroplating process from about 1 μm to 20 μm based on the substrate lamination material thickness and required electrical performance.

The process of the present disclosure will provide higher electrical performance. Other advantages of the WLCSP of the present disclosure include:

1. Enabling the current WLCSP structure to be embedded into a substrate with high current carrying capability.
2. Better heat dissipation in the substrate structure.
3. No solder balls exist in this structure, thus minor cost savings can be expected.

Figure 1:
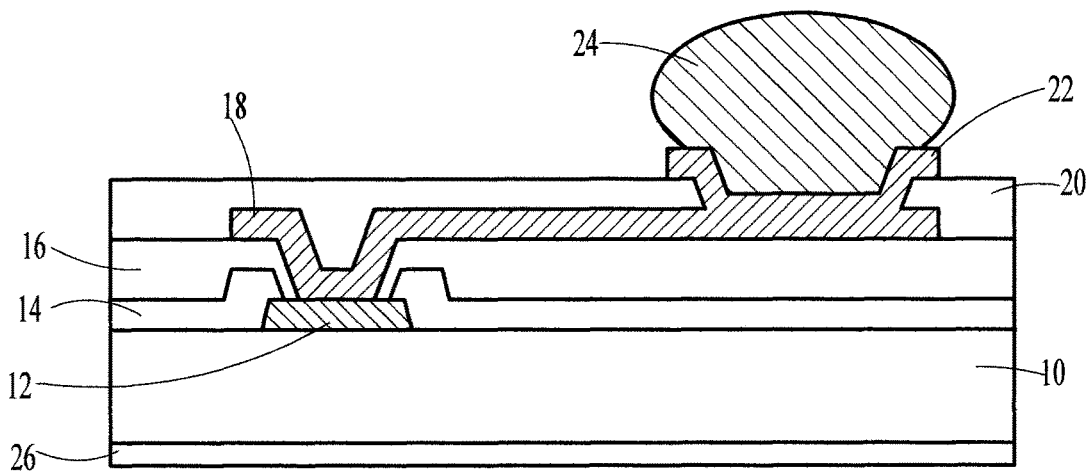
FIG. 1 is a cross-sectional representation of a silicon die of the prior art.

FIG. 1 illustrates a traditional WLCSP in the production stage. An opening is made to the aluminum pad 12 on the die 10 through the die passivation layer 14. First dielectric layer 16 is deposited, then patterned to provide an opening for the RDL layer 18. Second dielectric layer 20 is deposited over the patterned RDL. Dielectric layer 20 is patterned to form an opening for the UBM 22 which is also patterned. Solder ball 24 is placed onto the UBM. Backside film 26 protects the silicon die 10 from chipping.

Figure 2:
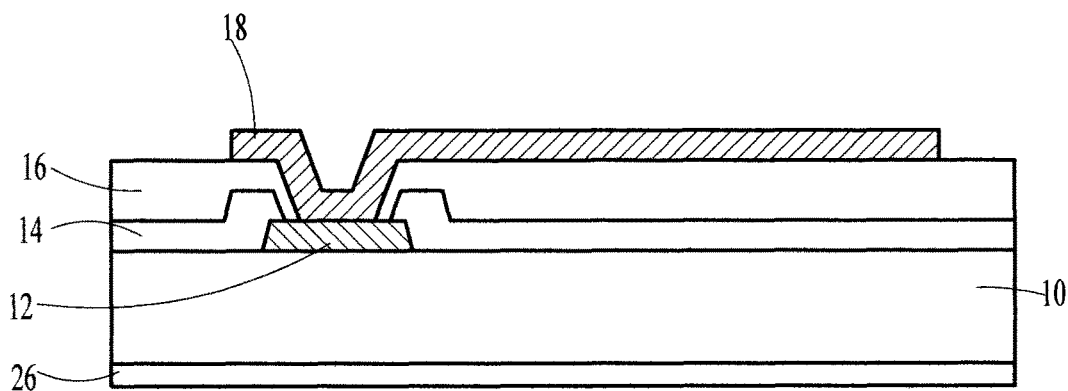
FIGS. 2-3 are cross-sectional representations of a silicon die of the present disclosure.

Referring now to FIGS. 2-8, the process of fabricating a WLCSP of the present disclosure will be described in detail. As illustrated in FIG. 2, the package of the present disclosure is fabricated similarly to the traditional package. An opening is made to the aluminum pad 12 on the die 10 through the die passivation layer 14. First dielectric layer 16 is deposited, then patterned to provide an opening for the RDL layer 18. RDL layer 18 is plated to the desired thickness and patterned as shown in FIG. 2.

Figure 3:
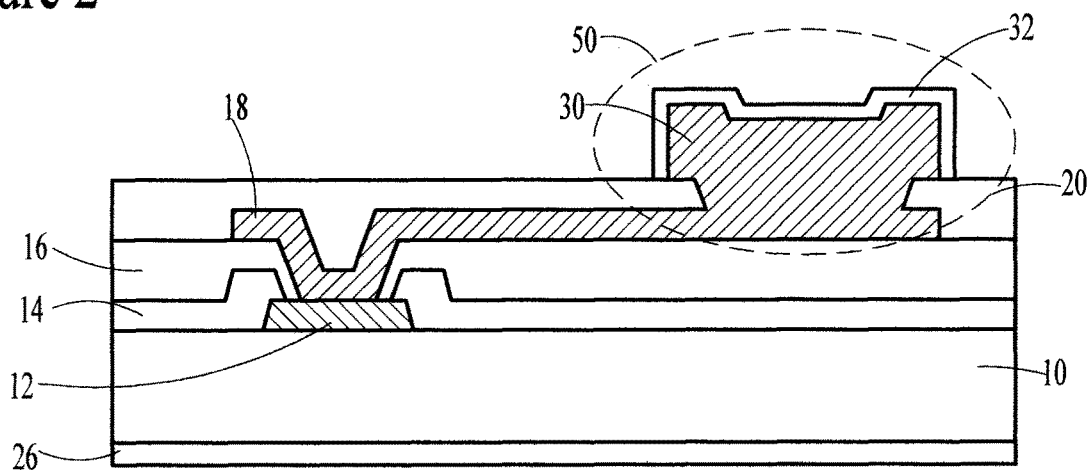

Referring now to FIG. 3, a second dielectric layer 20 is deposited over the patterned RDL layer 18. Preferably the second dielectric layer 20 is a passivation material such as polybenzoxazole (PBO) or polyimide (PI). The passivation layer is patterned using a photolithography process to provide openings where copper posts will be formed. Copper (Cu) posts 30 are formed on the RDL layer 18. A seed layer, not shown, is deposited over the passivation layer 20 and patterned RDL layer 18 by a physical vapor deposition (PVD) process, such as evaporation or a sputtering process under vacuum conditions, or a chemical vapor deposition (CVD) process, such as metal-organic CVD (MOCVD) or metal-organic Vapor-Phase Epitaxy (MOVPE). Preferably, the seed layer will be titanium or copper.

A photoresist mask is formed with openings where copper posts are to be placed and to define the Cu post diameter size which is larger than the passivation layer 20 opening size. Copper posts 30 are plated onto the seed layer in the openings to the desired Cu post height. The Cu post thickness can be from about 1 μm to 20 μm based on the substrate lamination material thickness and required electrical performance. The photoresist material and the seed layer not covered by the copper posts are chemically removed.

After Cu post preparation, an extra organic solderability preservative (OSP) material 32 can be prepared to further protect the Cu posts from oxidation. Later, this OSP material 32 will be removed by physical plasma or chemical etching before the via plating process. After the OSP process, the wafer can be further thinned down to the desired thickness, tested, have its backside ground, and singulated into package form.

Figure 4:
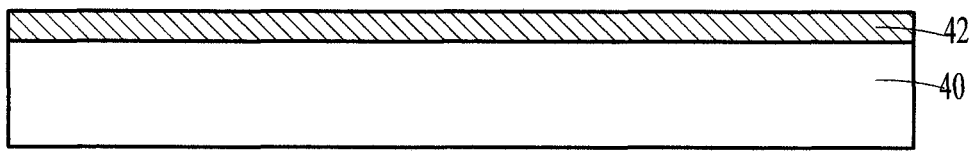
FIGS. 4-9 are cross-sectional representations of a wafer level chip scale package of the present disclosure.
Figure 5:
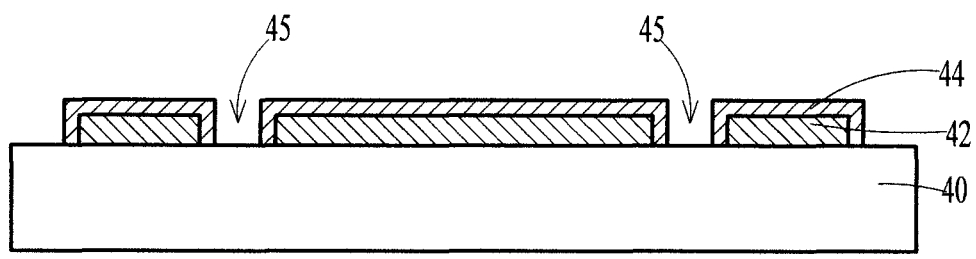

Next, a substrate is prepared. FIG. 4 illustrates a resin coated copper (RCC) substrate. Solder mask material 40 is shown coated with a copper layer 42. Referring now to FIG. 5, alignment patterns 45 for the die attach process will be defined by a photolithography process and generated by a further developing and etching process in the copper side of the RCC. An extra metal plating 44 may be made on the copper layer 42 after the alignment patterns 45 have been generated. The extra metal plating 44 may also be copper or a nickel-plated material. It will be added in case the coated copper 42 from the RCC substrate is not thick enough for the high current application required for the semiconductor die 10. The copper layer 42 is preferably 5-10 μm thick. The copper substrate provides electromagnetic shielding capability as well as high current carrying capacity.

Figure 6:
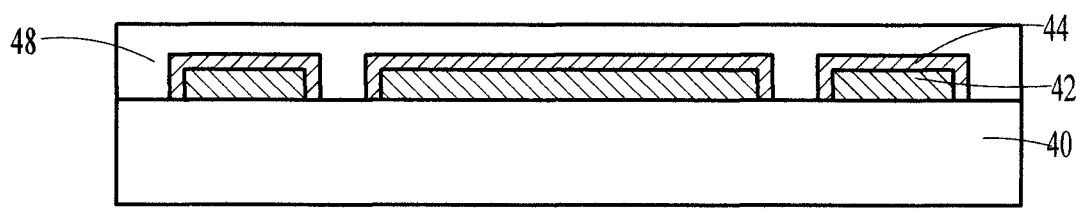

The die bonder can identify the alignment patterns 45 on the substrate side and the die side to do the die attachment process. An extra lamination layer 48 can be deposited or laminated over the RCC substrate 40, as shown in FIG. 6, as a stop layer to stop copper from layers 42/44 from penetrating into the die substrate 10. The layer 48 may be an an epoxy-based composite such as Ajinomoto Build-up Film (ABF) or pre-impregnated composite fiber (PP) materials, for example. Preferably, the layer 48 may have a thickness of between about 5-30 μm.

Figure 7:
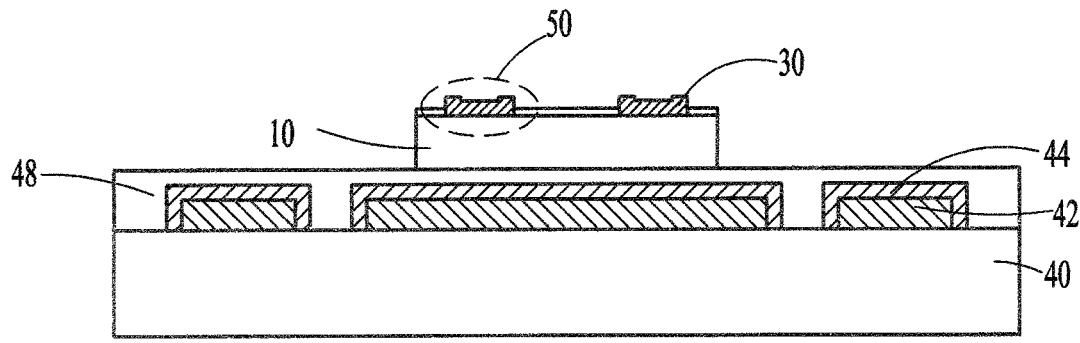

Now, as illustrated in FIG. 7, the die 10 of FIG. 3 is attached to the top layer of the substrate 40 by a die attach process. Copper post 30 is shown in the circle 50 in both FIGS. 3 and 7.

Figure 8:
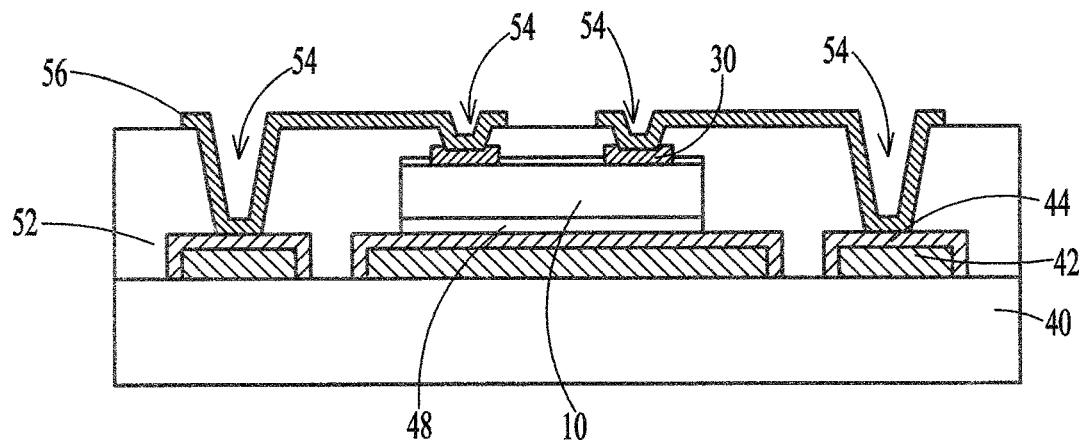
Figure 9:
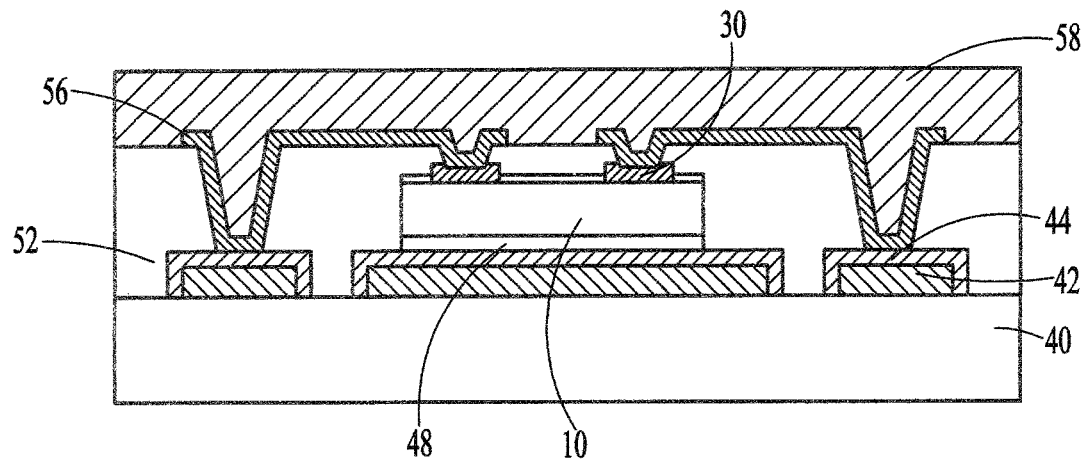

One example of further manufacturing flow is shown in FIGS. 8 and 9. Lamination material 52 is coated over the substrate and the die, as shown in FIG. 8. The lamination material 52 may be ABF, PP, or a thick resin as in the RCC substrate. The lamination material may be 50~250 μm in thickness. The Cu posts 30 are covered by the lamination material. Now, openings are to be made through the lamination material to the Cu posts 30 and to copper pads 42 on the substrate outside of the die 10.

Laser drilling is preferred to create via openings 54 through the lamination layer 52. A certain laser type can be selected which will not damage the copper surface or generate too much heat. Laser drilling is more cost effective in this process than a photolithography process and provides high accuracy, high etch rate, and high anisotropy. A photoresist material rather than the lamination material can be considered, but the overall cost to prepare the substrate will be higher. Thinner lamination material might be 30-50 μm in thickness, and it depends on the final thickness requirement. The second passivation layer 20 helps avoid damage from laser drilling.

Figure 10:
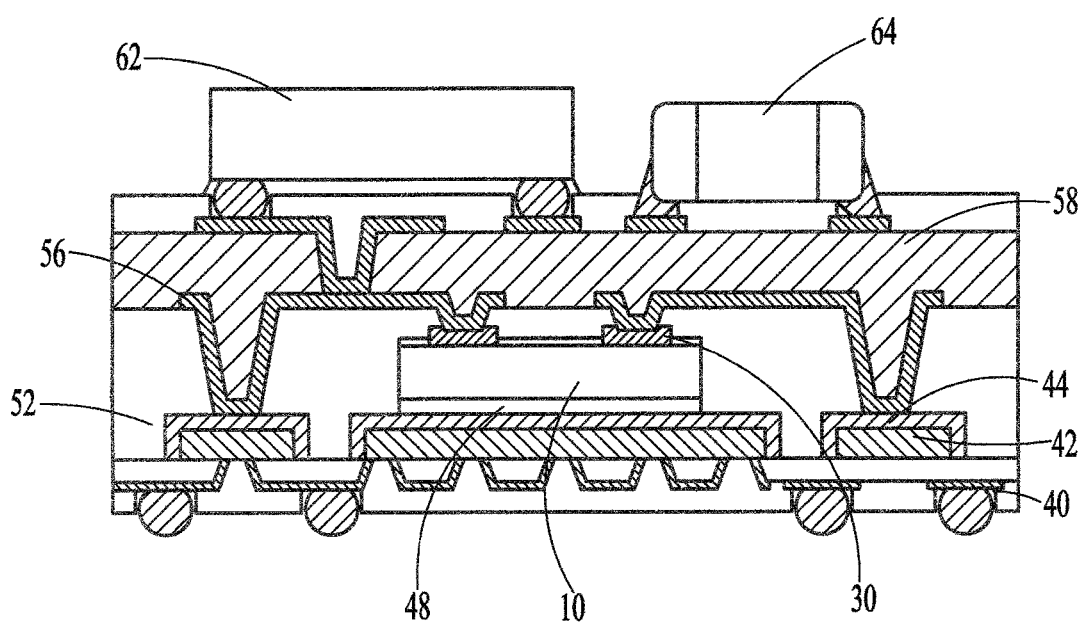
FIG. 10 is a cross-sectional representation of one example of a completed wafer level chip scale package of the present disclosure.

After the laser drilling process, the OSP 32 layer covering the copper posts (shown in FIG. 3) needs to be removed within the laser drilled via openings. This is done by a physical plasma, chemical etching, or reflow process. Next, copper plating 56 is performed within the via openings to form connections as desired in the package and as shown in FIGS. 8 and 9. Finally, a solder mask 58 is laminated over the copper connections to complete the WLCSP, as shown in FIG. 9. FIG. 10 shows an option where other chips and passive devices 62 and 64 are connected to the WLCSP.

Compared with the traditional WLCSP structures, the WLSCP structures of the present disclosure have no solder balls placed onto the Cu post structure. If solder balls were placed onto the Cu posts, this would increase the height and difficulty to force the lamination material 50 to fill in underneath the solder balls. Normally solder is used for interconnection with a substrate, but this is not necessary for the die embedded in the substrate in the present disclosure.

Furthermore, the process of the present disclosure does not require a backside lamination film on the silicon die back side. The purpose of a backside lamination film is to protect the silicon backside from chipping and light radiation. However, as seen in FIG. 9, the backside of the die is embedded into the substrate material which will further protect it. The absence of the backside lamination film also saves cost.

The Cu posts on the die may have a height of between 1 and 20 μm, and optionally up to 100 μm. If the Cu post thickness is too thin, the RDL Cu pad might be damaged by the laser via opening process after the die attach which may impact electrical performance of the package. If the Cu post thickness is too thick, a thicker lamination material will be required and voids might form in the thick lamination layer.

The WLCSP of the present disclosure comprises a silicon die embedded in a substrate having high current carrying capacity and electromagnetic shielding. The die on the substrate is laminated and laser drilled via openings are made to copper posts on the die and metal pads on the substrate for further interconnection.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A wafer level chip scale package comprising:
    a silicon die, comprising:
        at least one redistribution layer (RDL);
        a passivation layer on said RDL; and
        at least one copper post at a top surface of said silicon die, said at least one copper post contacting said at least one RDL through an opening in said passivation layer to said at least one RDL wherein said at least one copper post has a larger diameter than a diameter of said opening to said at least one RDL;

wherein a bottom surface of said silicon die is die attached to a metal substrate comprising:
- a solder substrate;
- a copper layer on said solder substrate;
- a copper or nickel-plated layer on said copper layer; and
- a stopper layer on said copper or nickel-plated layer comprising epoxy-based composite or pre-impregnated composite fiber (PP) materials wherein said silicon die is above said copper or nickel-plated layer and said stopper layer lies between said silicon die and said copper or nickel-plated layer to prevent copper or nickel from penetrating into said silicon die; and
- metal vias through a lamination layer spaced from sidewall of said copper layer by said copper or nickel-plated layer on sidewalls of said copper layer, on sidewalls and overlying said silicon die, and overlying said metal substrate, said metal vias providing connections to said at least one copper post on said silicon die and to at least one metal pad on said metal substrate.

2. The package according to claim 1 wherein said lamination layer comprises an epoxy-based composite, pre-impregnated composite fiber (PP) materials, or resin.

3. The package according to claim 1 further comprising a solder mask over said metal vias.

4. A method of fabricating a wafer level chip scale package comprising:
- providing at least one redistribution layer (RDL) on a silicon substrate;
- depositing a passivation layer on said RDL;
- etching first openings having a first diameter in said passivation layer where copper posts are to be formed;
- depositing a seed layer over said passivation layer and within said openings;
- coating a photoresist layer on said seed layer and patterning said photoresist layer to form second openings having a second diameter over said first openings wherein said second diameter is larger than said first diameter;
- plating copper on said seed layer in said first and second openings to form said copper posts filling said second openings to complete formation of a silicon die;
- thereafter die attaching said silicon die to a metal substrate;
- coating a lamination layer over said metal substrate, said silicon die, and said copper posts;
- forming third openings through said lamination layer to said copper posts and to metal pads on said metal substrate;
- forming metal vias in said third openings; and
- covering said metal vias with a solder mask to complete said wafer level chip scale package.

5. The method according to claim 4 wherein said passivation layer comprises polybenzoxazole (PBO) or polyimide (PI).

6. The method according to claim 4 wherein said copper posts have a thickness of between about 1 µm and 100 µm, and preferably about 1 µm and 20 µm.

7. The method according to claim 4 further comprising:
- depositing an organic solderability preservative (OSP) layer onto said copper posts prior to said die attaching step; and
- removing said OSP layer in said third openings prior to forming said metal vias.

8. The method according to claim 4 wherein said metal substrate comprises:
- a solder substrate,
- a copper layer on said solder substrate;
- a copper or nickel-plated layer deposited on said copper layer; and
- a stopper layer on said copper or nickel-plated layer comprising epoxy-based composite or pre-impregnated composite fiber (PP) materials.

9. The method according to claim 4 wherein said lamination layer comprises an epoxy-based composite, pre-impregnated composite fiber (PP) materials, or resin.

10. A method of fabricating a wafer level chip scale package comprising:
- providing at least one redistribution layer (RDL) on a silicon substrate;
- depositing a passivation layer on said RDL;
- etching first openings having a first diameter in said passivation layer where copper posts are to be formed;
- depositing a seed layer over said passivation layer and within said openings;
- coating a photoresist layer on said seed layer and patterning said photoresist layer to form second openings having a second diameter over said first openings wherein said second diameter is larger than said first diameter;
- plating copper on said seed layer in said first and second openings to form said copper posts filling said second openings to complete formation of a silicon die;
- providing a metal substrate comprising:
  - providing a solder substrate;
  - depositing a copper layer on said solder substrate;
  - depositing a copper or nickel-plated layer on said copper layer; and
  - forming a stopper layer on said copper or nickel-plated layer comprising epoxy-based composite or pre-impregnated composite fiber (PP) materials;
- thereafter die attaching said silicon die to said metal substrate;
- coating a lamination layer over said metal substrate, said silicon die, and said copper posts;
- forming third openings through said lamination layer to said copper posts and to metal pads on said metal substrate;
- forming metal vias in said third openings; and
- covering said metal vias with a solder mask to complete said wafer level chip scale package.

11. The method according to claim 10 wherein said passivation layer comprises polybenzoxazole (PBO) or polyimide (PI).

12. The method according to claim 10 wherein said copper posts have a thickness of between about 1 µm and 100 µm, and preferably about 1 µm and 20 µm.

13. The method according to claim 10 further comprising:
- depositing an organic solderability preservative (OSP) layer onto said copper posts prior to said die attaching step; and
- removing said OSP layer in said third openings prior to forming said metal vias.

14. The method according to claim 10 wherein said lamination layer comprises an epoxy-based composite, pre-impregnated composite fiber (PP) materials, or resin.

* * * * *